United States Patent
Hauenstein

(10) Patent No.: US 6,744,250 B2
(45) Date of Patent: Jun. 1, 2004

(54) DEVICE FOR MEASURING THE STRENGTH OF A VECTOR COMPONENT OF A MAGNETIC FIELD, CURRENT-MEASURING DEVICE AND USE OF A FIELD-EFFECT TRANSISTOR

(75) Inventor: Henning Hauenstein, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/238,489

(22) Filed: Sep. 9, 2002

(65) Prior Publication Data
US 2003/0071616 A1 Apr. 17, 2003

(30) Foreign Application Priority Data
Sep. 8, 2001 (DE) .......................... 101 44 268

(51) Int. Cl.[7] ........................... G01R 33/02; H01I 29/78
(52) U.S. Cl. ....................... 324/252; 257/330
(58) Field of Search ................ 324/252, 104, 324/105, 713, 716, 719, 763, 765; 327/512, 513, 78, 83, 68, 65, 89; 438/14, 17; 365/185.09, 201; 323/312, 315, 316; 257/421, 422, 330, 331, 332, 334

(56) References Cited

U.S. PATENT DOCUMENTS

| | | | | |
|---|---|---|---|---|
| 4,048,648 A | * | 9/1977 | Vinal | .......................... 257/252 |
| 4,141,023 A | * | 2/1979 | Yamada | ....................... 257/364 |
| 5,208,477 A | * | 5/1993 | Kub | ........................... 257/421 |
| 5,446,307 A | | 8/1995 | Lux et al. | |
| 5,757,055 A | * | 5/1998 | Kalb, Jr. | ...................... 257/421 |
| 5,926,414 A | * | 7/1999 | McDowell et al. | ......... 365/170 |
| 6,566,177 B1 | * | 5/2003 | Radens et al. | .............. 438/152 |
| 6,570,207 B2 | * | 5/2003 | Hsu et al. | .................... 257/302 |

FOREIGN PATENT DOCUMENTS

JP          04171770          6/1992

OTHER PUBLICATIONS

S. Kordic, "Integrated Silicon Magnetic–Field Sensors", Sensors and Actuators, 10 (1986) pp. 347–378.

* cited by examiner

Primary Examiner—Jay Patidar
Assistant Examiner—Reena Aurora
(74) Attorney, Agent, or Firm—Kenyon & Kenyon

(57) ABSTRACT

A device for measuring the strength of a vector component of a magnetic field, a current-measuring device and a use of a field-effect transistor are proposed, the orientation of the wall of the at least one first trench gate being provided orthogonally with respect to the magnetic-field vector component to be measured.

4 Claims, 2 Drawing Sheets

DEVICE FOR MEASURING THE STRENGTH OF A VECTOR COMPONENT OF A MAGNETIC FIELD, CURRENT-MEASURING DEVICE AND USE OF A FIELD-EFFECT TRANSISTOR

BACKGROUND INFORMATION

Particularly in the automobile sector, the number of potential areas of use for magnetic field sensors is growing; in particular, magnetic field measurement can be used, inter alia, for the non-contact, low-loss and potential-free measurement of currents. An example is the determination of electrical operating parameters of generators and electric drives, such as the current intensity, the current direction and the like of the three phases of a three-phase generator.

Presently, it is general state of the art to measure the magnetic field or its strength using magnetic-field sensors such as Hall sensors, bipolar magneto-transistors, magneto-resistive resistors, lateral magnetic field-effect transistors (MagFET structures) and the like. In general, the sensors are produced as autonomous components, and must be mounted separately in the application. This may result in considerable additional integration costs for system manufacturers.

SUMMARY OF THE INVENTION

Sturdy and inexpensive sensors of small size which measure the magnetic field in general, and particularly those magnetic fields produced by currents through conductors, as accurately as possible are desirable especially for the automobile sector, but not exclusively for it. The present invention describes a new type of sensor element which is based on the known trench MOS semiconductor technology, and therefore may be produced relatively easily by existing processes or integrated into them. Moreover, according to the invention, the possibility is provided of producing a new type of intelligent circuit breaker with integrated current sensor, particularly on a single substrate, i.e. on a single chip.

The essence of the invention is to use the vertical MOS channel of a trench MOSFET for sensing the magnetic field. In the presence of a magnetic field, the Lorentz force deflects the moved charge carriers, and thus increases the resistance in the MOS channel. This increase in resistance leads to a source-drain current change—i.e. alternatively to a change in voltage in the case of an impressed predefined current through the MOS channel—which may be used as a measure for the strength of the existing magnetic field. By suitable structuring of the MOSFET cells, the present invention likewise provides for detecting the deflection of the charge carriers from the originally vertical current direction as a measuring signal. In contrast to planar MOS structures like, for example, in the case of MagFETs, according to the present invention, the vertical profile of the trench MOS channels makes it possible to measure magnetic fields which run parallel to the substrate surface or the chip area.

The following advantages in particular are realized according to the present invention: The device of the invention and the current sensor of the invention are based on a known trench MOS technology, which may therefore be integrated relatively simply and cost-effectively into existing semiconductor process flows. Trench-MOS processes are used by well-known semiconductor manufacturers in large quantities for field-effect transistors (FET), particularly as power transistors, and especially in the automobile sector, so that process experience and possibly even field experience is already available in this regard.

The decisive advantage of the invention is that the trench-MOS technology may be used both for implementing the switching function of the field-effect transistor and for the sensor function. The possibility is thereby created of producing a new type of intelligent field-effect transistor with integrated current sensor in a single process flow or on a single chip, i.e. in monolithic integration.

Since many applications, which rest increasingly today on MOS technology, actively control and switch, it presents itself to manufacture the sensor element needed for the current/magnetic-field measurement using the same technology. In this case, the switching and sensor functions may be combined particularly advantageously. According to the invention, the MOSFET technology is particularly usable for a high-current application such as, for example, in the electric-motor and generator field.

For applications in which currents must both be switched and actively controlled or measured, the present invention presents an optimal combination of these two functions. For example, this current is controlled via a MOSFET, i.e. a power MOSFET through which the main current flows. Because the current sensor, i.e. the current-measuring device, is integrated directly on the chip, that is, particularly the semiconductor substrate of the power transistor, the sensor element, or rather the current-measuring device, is situated in the immediate vicinity, that is, at a microscopic distance from the magnetic field generated by the main current.

In contrast with that, alternative concepts based on separate sensor elements must use costly mounting techniques in order to place the sensor element sufficiently close to the current-carrying conductor. At the same time, possible interference effects due to parasitic magnetic stray fields must be screened off as well as possible. In this context, it is particularly disadvantageous that the strength of the magnetic field to be measured generally decreases sharply with increasing distance from the current conductor carrying the current to be measured, the influence of adjacent interference fields increasing simultaneously, however. Therefore, it is particularly advantageous for a high measuring quality of the current-measuring device according to the invention that the sensor element may be placed in the immediate vicinity of the conductor through which the main current is flowing. According to the present invention, costly screening measures and possibly the use of additional flux concentrators for the magnetic field to be measured do not therefore have to be used, or must be used only to a lesser extent, which has a positive effect both on the costs and on the size of the device and the current-measuring device, respectively, of the present invention.

In the same way, the present invention provides for using the device and the current-measuring device in environments which are heavily loaded electromagnetically. To this end, it is provided according to the present invention to use a screening against parasitic interference fields, this being easy to implement by screening the entire chip, i.e. both the circuit breaker and the sensor, against external influences using a suitable packing, without at the same time impairing the coupling between the sensor and the current-carrying circuit breaker.

A further advantage of the device and of the current-measuring device according to the present invention is that the vertical MOS channels exhibit a greater sensitivity to lateral magnetic fields which run parallel to the chip surface. Here, the present invention differs in particular from the known lateral MagFET sensors, which measure magnetic fields that are vertical relative to the horizontally assumed chip surface, by change of the current direction in the MOS channel running parallel to the chip surface. Therefore, when using the present invention, it is possible to utilize the large-area chip topside itself in particular for screening measures against interference fields, while the field components necessary for the measurement penetrate laterally into the chip. The vertical trench-MOS sensor is sensitive only to these lateral field components; vertical interference fields are not taken into account.

The sensitivity of the magnetic-field sensor according to the present invention and the current-measuring device according to the present invention may be adjusted by varying the trench-cell density, the trench-cell dimensioning and the trench-cell layout. It is also possible to combine different cell geometries on one chip, to thereby implement various sensitivities simultaneously. According to the invention, it is advantageous to use such a multi-channel sensor chip in order to utilize a single sensor chip for a very large measuring range; such a large measuring range could otherwise only be covered by a combination of various sensor elements.

According to the present invention, in contrast to conventional circuit breakers, the trench-MOS cells of the device and of the current-measuring device are advantageously provided with a cell structure such that the current-sensor cells, and here in particular the trench gate wall of cells electrically coupled to one another, are all aligned orthogonally with respect to the magnetic-field component to be measured, to on one hand optimize the measuring sensitivity, and on the other hand to avoid falsification of the measurement due to magnetic-field components which are oriented differently. In the case of a linearly extending magnetic-field direction to be measured, the MOS channels along the trench walls according to the present invention are all to be aligned parallel to one another, so that all channels run orthogonally with respect to this linear magnetic-field direction.

If a plurality of magnetic-field directions or various vector components of a magnetic field are to be measured using a single chip, then for each magnetic-field component to be measured, a certain number of interconnected sensor cells are to be provided having in each case MOS channels running parallel to one another. The cell regions provided for different magnetic-field directions or vector components of a magnetic field are to be separated from one another from the standpoint of measuring and evaluation technology. The respective source-drain operating current must be supplied separately for different sensor-cell regions, to permit the separate measurement of the different magnetic-field components, and thus to avoid mixing of the measurement of the different magnetic-field components. This means that the sensor source-drain operating current must be separate at at least one location, but it may possibly be reunited at a second location; for example, according to the present invention, in the case of separate source connections, a shared drain connection is sufficient to be able to distinguish the resistance change of two different sensor cells, since in this case, the drain may be used as a common reference potential. This is particularly advantageous with respect to manufacturing, since generally only the front side of the wafer is patterned, but not the backside metallization (drain).

If curved magnetic fields, particularly annular magnetic fields are to be measured, then the orientations of the trench MOS channels are to be provided in the sensor structure in such a way that the annular magnetic lines of force always lie orthogonally with respect to the MOS channel structure, that is to say, that the walls of the trench gates are oriented such that their imaginary straight extensions essentially intersect at a common point. Generally, in the case of curved magnetic fields, the walls of the trench gates are provided in such a way that they are parallel to the local radius of curvature of the curve.

In the special case of a circle-symmetrical magnetic field, the required orthogonality of the trench gate walls with respect to the magnetic-field component to be measured is producible, for example, by cell structures running radially, i.e., running outwardly in a star shape. In this special case, the sensor cells may in fact all be evaluated, i.e., jointly wired, electrically in parallel, since although different directions of the magnetic field in space occur here—because the magnetic field is assumed to be round—nevertheless, only a single annular magnetic-field component is measured, it being measured correctly at any location due to the orientation of the trench gate walls of the MOS channels of the sensor cells which runs outwardly in a ray shape according to the present invention.

In general, known integrated current-sensor concepts utilize a portion of the current to be measured, in order to measure, for example, the flowing current via an integrated shunt resistor. The novelty of the present invention is that the integrated current sensor utilizes the magnetic field, and is thereby advantageously decoupled from the main current to be measured.

BRIEF DESCRIPTION OF THE DRAWINGS

FIG. 1a shows an alternative specific embodiment of a cross-section of a trench MOS cell, using a mixed process, for example, a BCD process (bipolar CMOS-DMOS process).

DETAILED DESCRIPTION

Figure 1A:
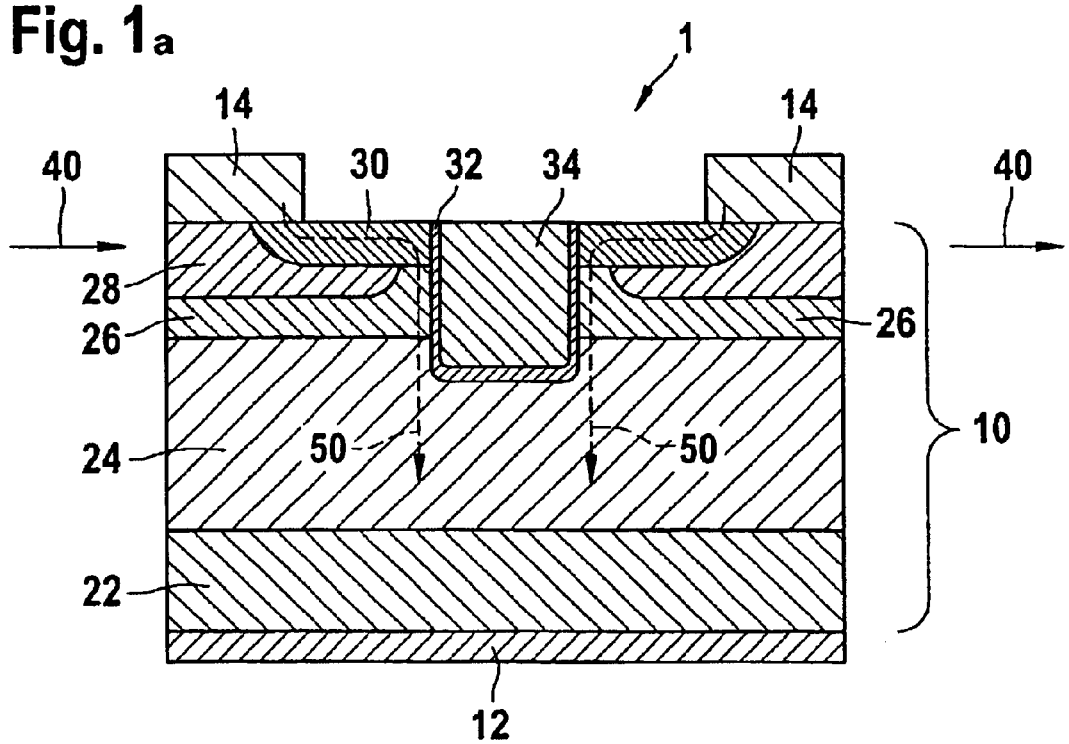
FIG. 1a shows a schematic drawing in cross-section of a trench MOS cell having vertical MOS channels.

FIG. 1a shows a schematic drawing of a trench MOS cell having vertical MOS channels. The trench MOS cell is represented in its cross-section by reference numeral 1. The magnetic-field component to be measured of the magnetic field that is to be measured according to the present invention is represented by arrows which bear the reference numeral 40. The structure of the trench MOS cell of the present invention is provided according to a conventional trench MOSFET. Such a one includes a backside metallization 12, a substrate 10 and a front-side metallization 14. Backside metallization 12 is used as the drain connection of the MOS cell. Front-side metallization 14, which in particular is patterned, is used as the source connection. In substrate 10, which in particular is provided as a semiconductor substrate based on silicon, various regions are provided according to the invention in cross-section 1 of the trench MOS cell, and specifically, a first substrate region 22 having a doping of a first charge-carrier type is provided directly adjacent to backside metallization 12. Adjoining first substrate region 22 in the direction facing away from backside metallization 12 is a second substrate region 24 that is likewise provided with a doping of the first charge-carrier type, but which has a lower dopant concentration than the doping of first substrate region 22 provides. Contiguous to second substrate region 24 in the direction facing away from first substrate region 22—at least in partial regions—is a third substrate region 26 that is provided with a doping of a second charge-carrier type different from the first charge-carrier type.

In such partial regions of substrate 10 in which third substrate region 26 is not adjacent to second substrate region 24, adjoining second substrate region 24 are a sixth and seventh substrate regions 32, 34 which form the gate and the gate oxide, respectively. In this context, sixth substrate region 32 exclusively adjoins second substrate region 24, while seventh substrate region 34 is completely isolated from all remaining substrate regions by sixth substrate region 32. Seventh substrate region 34 corresponds to the gate connection, i.e., the gate of the device according to the invention. Sixth substrate region 32 to the gate oxide of the device according to the invention. Laterally next to gate 34, i.e., gate oxide 32, third substrate region 26 and a fifth substrate region 30 extend between the surface of substrate 10 and second substrate region 24. The fifth substrate region is provided with a doping of the first charge-carrier type. In this context, the doping of fifth region 30 is heavier than the doping of second substrate region 24 with the first charge-carrier type. Not adjacent to gate oxide 32, but lying at least partially between third substrate region 26 and fifth substrate region 30, a fourth substrate region 28 is provided which is likewise doped with the second charge-carrier type and has a higher doping than third substrate region 26. The present invention provides in particular that negative charge carriers correspond to the first charge-carrier type, and that positive charge carriers correspond to the second charge-carrier type, however, the reverse case also being provided according to the invention. The trench gate wall corresponds to the vertical portion of sixth substrate region 32, that is, of gate oxide 32. The areas of third substrate region 26, of fifth substrate region 30 and partially of second substrate region 24 adjacent to the trench gate wall correspond to the location at which the magnetic field, i.e. its component to be sensed, is sensed according to the present invention.

According to the invention, front-side metallization 14 borders both on fourth substrate region 28 and partially on fifth substrate region 30, front-side metallization 14 being separate, set apart or at least insulated, however, from gate oxide 32 and from gate 34.

In the standard trench MOS process, the silicon wafer substrate corresponds to first substrate region 22. The drift region corresponds to second substrate region 24. The so-called body region corresponds to third substrate region 26. The contact diffusion corresponds to fourth substrate region 28, and the source region corresponds to fifth substrate region 30.

Figure 1B:
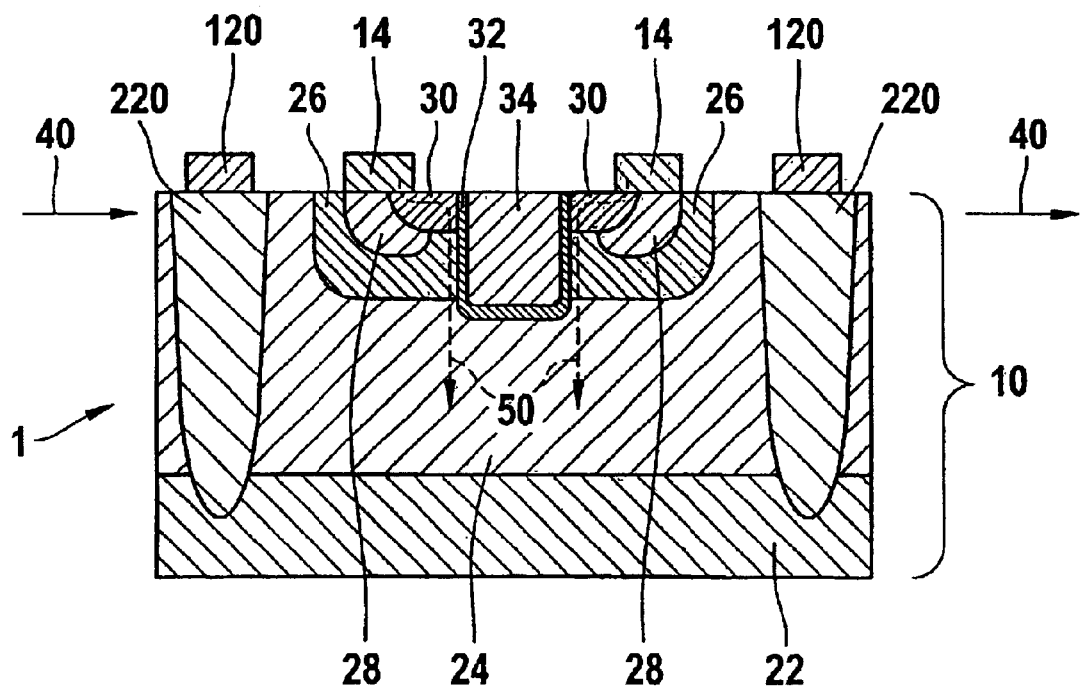

FIG. 1b shows an alternative specific embodiment of a cross-section of a trench MOS cell, using a mixed process, for example, a BCD process (bipolar CMOS-DMOS process). Identical reference numerals used in FIG. 1a and in FIG. 1b designate identical components and identical regions of the substrate. However, in contrast to the cross-section shown in FIG. 1a, in the cross-section shown in FIG. 1b, using BCD processes, the sensor cell does not have to extend to the backside of the wafer. Here, the drain connection, which is provided with reference numeral 120 in FIG. 1b and is now part of the front-side metallization, may be brought via a so-called buried region or buried regions and one or more sinker structures, which in FIG. 1b are provided with the reference numeral 220 and in the following are referred to as sinker layer 220, to the chip topside (i.e. the front side of the chip). Sinker layer 220 contacts first substrate region 22 and is doped with the first charge-carrier type in a doping which is at least as great or else higher. Here, the drain connection, designated in FIG. 1b by reference numeral 120, rests on the chip topside. A current, shown by a dotted line and provided with reference numeral 50, which flows vertically in the component, is conducted via second substrate region 24, first substrate region 22 and sinker layer 220 to drain connection 120, i.e. to the chip topside. This yields the advantage that any patterning of the source-drain metallizations as desired—which here are both located on the chip topside—may be carried out. The chip or wafer backside, not shown in FIG. 1b and situated below first substrate region 22, may in principle be unpatterned here, i.e. homogeneously metallized, without function for the sensor cell. Another advantage in the specific embodiment shown in FIG. 1b compared to the specific embodiment shown in FIG. 1a, is that the driving or possible linkage of a plurality of sensor cells may be implemented more easily then if one would have to provide structures and contacts on the wafer backside.

First substrate region 22 is also designated in FIG. 1b as buried layer. Below it, (not shown in FIG. 1b), is the actual wafer substrate, doped less heavily than first substrate region 22 with the first charge-carrier type in the exemplary embodiment shown, and the wafer backside metallization. In the case of the standard power MOS cross-section shown in FIG. 1a, such an additional substrate layer is absent, because the sensor cell in this case must reach to the wafer backside.

In FIG. 1b, the drift region also corresponds to second substrate region 24. The so-called "body region" in FIG. 1b also corresponds to third substrate region 26. In FIG. 1b, the contact diffusion also corresponds to fourth substrate region 28. The source region corresponds to fifth substrate region 30 in FIG. 1b, as well.

Cross-section 1 of the trench MOS cell of the present invention according to FIGS. 1a and 1b functions analogously to a conventional trench MOS cell, that is to say, in response to appropriate voltage applied at gate 34, the resistance between source connection 14 and drain connection 12 diminishes in such a way that a current-carrying channel, the so-called MOS channel, develops in which a current begins to flow from source connection 14 to drain connection 12. The current thus produced is represented in FIG. 1a by the dotted arrow directed in each case on both sides along gate 34, i.e. gate oxide 32, the arrow being provided with reference numeral 50.

The switching function of the transistor is therefore achieved by applying a voltage to gate electrode 34, a narrow vertical MOS channel thereby forming along the side wall of the gate trench, which is also known as trench gate. Current 50, marked in in FIG. 1a and FIG. 1b, is a function in particular of the applied source-drain voltage and the channel resistance.

If now, in addition, a magnetic field 40, i.e. a magnetic-field component 40, exists parallel to the chip surface, that is, parallel to the surface of substrate 10, then the Lorentz force leads to a deflection of the charge-carrier movement, that is to say, according to the present invention, in particular the electron movement perpendicular to the current flow and to the magnetic-field direction. In the schematic illustration of FIG. 1a and FIG. 1b, this means that a deflection of the charge carriers out of the drawing plane is produced, if positively charged charge carriers are assumed. Given the assumption of negatively charged charge carriers, the Lorentz force accordingly causes a deflection into the drawing plane. At any rate, a deflection of the charge carriers causes a change of the channel resistance, which in the following is also designated as $R_{DSon}$. This increase in the channel resistance leads to a change of source-drain current 50, it being possible to use such a change as a measure for the magnitude of adjacent magnetic field 40. Alternatively, it is conceivable to impress a constant drain current 50, and to measure the change in the source-drain voltage corresponding to the change in the channel resistance.

For the case when, due to a suitable potential applied at gate 34, the MOS channel exhibits a comparatively low resistance, yielded in the regions adjacent to the trench gate wall is a charge-carrier current in the vertical direction along the vertical portion of gate oxide 32 in a region of approximately 0 . . . 10 nm to approximately 0 . . . 100 nm distance from gate oxide 32. Due to the Lorentz force on the basis of magnetic-field component 40, the charge carriers are either deflected into the drawing plane or out of the drawing plane (specific to FIG. 1a and FIG. 1b). The smaller the extensions of the trench gate wall in the orthogonal direction with respect to the drawing plane, the greater the resistance change through the MOSFET channel caused by the deflection. Therefore, the present invention allows in particular for providing a plurality of such trench gate walls in the orthogonal direction with respect to the magnetic-field direction to be measured; the extension in this orthogonal direction is to be kept as small as possible.

The described sensor may be used as a single component for measuring magnetic fields 40 parallel to the chip area. It is suitable in particular for the non-contact, potential-free measurement of currents based on the effect of the magnetic field surrounding a current conductor. By combining various trench MOS cell geometries, trench MOS design variants or trench MOS layout variants, different sensitivities may be implemented and, if necessary, combined on a single chip.

Figure 2:
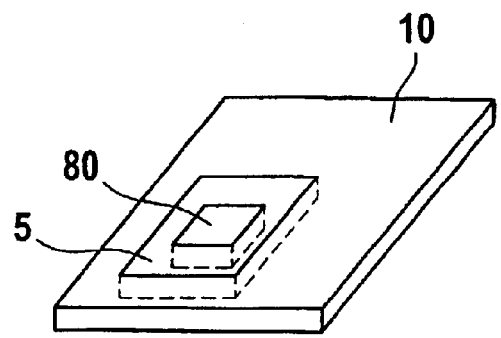
FIG. 2 shows a schematic drawing of a first exemplary embodiment of a trench power MOSFET having an integrated current-sensor suite.

FIG. 2 shows a schematic drawing of a first exemplary embodiment of a trench power MOSFET having an integrated current-sensor suite. On substrate 10, shown this time in perspective representation, situated in a partial area of the substrate is at least one trench power MOSFET, i.e. a cell structure of such a MOSFET. This cell structure, that is, this trench MOSFET is provided with reference numeral 80 in FIG. 2. It causes a vertical current flow in the orthogonal direction with respect to the surface of substrate 10. This power MOSFET is provided with reference numeral 80 in FIG. 2. Due to the vertical current flow, a magnetic field is produced which runs in the substrate plane of substrate 10, is essentially annular and runs around current-carrying region 80, this magnetic field not being represented by a reference numeral in FIG. 2. However, according to the present invention, the magnetic field caused by current-carrying region 80 assumes a comparatively high value in a further substrate region of the invention, which in the following is designated by the term sensor substrate region 5. To that end, sensor substrate region 5 should in particular be provided adjacent to current-carrying substrate region 80. The present invention provides in particular that sensor substrate region 5 completely surrounds current-carrying substrate region 80 in the plane of substrate 10.

Figure 3:
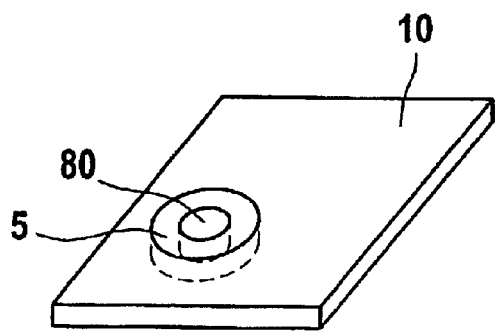
FIG. 3 shows a schematic drawing of a second exemplary embodiment of a trench power MOSFET having an integrated current-sensor suite.

FIG. 3 shows a second exemplary embodiment of a trench MOSFET according to the invention having an integrated current-sensor suite. Substrate 10 is likewise shown together with a current-carrying substrate region 80 and a sensor substrate region 5. In the case of the second specific embodiment of the invention, however, both current-carrying substrate region 80 and sensor substrate region 5 are round, sensor substrate region 5 again completely surrounding current-carrying substrate region 80 in the plane of the substrate.

Both in FIG. 2 and in FIG. 3, current-carrying substrate region 80 is composed in particular of cells of a standard power MOSFET as a current-switching circuit breaker. According to the present invention, sensor substrate region 5 is made of sensor cells as are shown in cross-section in FIG. 1a or FIG. 1b. Such sensor cells detect the annular magnetic field formed by the current flowing vertically through the chip in current-carrying region 80, and specifically only magnetic-field component 40 which, as shown in FIG. 1a and FIG. 1b, meets orthogonally with the wall of trench gate 34, there where current 50 is marked in in FIG. 1a and in FIG. 1b. Thus, according to the present invention, what matters is the trench gate walls arranged orthogonally with respect to the magnetic-field component to be measured in each case.

Figure 4:
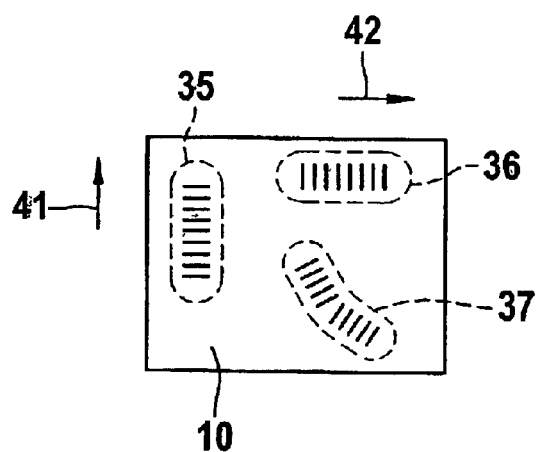
FIG. 4 shows a first exemplary embodiment of an arrangement of trench gates.

FIG. 4 shows a first exemplary embodiment of an arrangement of trench gates; orientations of trench gates 34 from FIG. 1a and FIG. 1b respectively, with respect to the magnetic field to be detected, i.e. the magnetic-field component to be detected are shown particularly clearly. In FIG. 4, first walls of trench gates in the top view of substrate 10 are designated by reference numeral 35. The walls of these first trench gates all run in parallel and orthogonally with respect to a first vector component of a magnetic field, which is shown provided with an arrow and reference numeral 41. Furthermore, other walls of the first trench gates are represented by reference numeral 36 in FIG. 4, which again are oriented orthogonally with respect to a second magnetic-field vector component to be measured, the second vector component being shown provided with an arrow and reference numeral 42. Moreover, walls of second trench gates are shown in FIG. 4 and provided with reference numeral 37. These second trench gates 37 are arranged at an acute angle or an obtuse angle, but on no account at a right angle, with respect to first trench gates 35, 36. A summary wiring with the aid of common source and drain connections of second trench gates 37 with one of the two groups of first trench gates 35, 36 would lead to a falsification of the measuring results if a magnetic field which includes first magnetic-field component 41 or second magnetic-field component 42 were to be measured with the device. Therefore, as far as the wiring with source and drain connections is concerned, first trench gates 35, 36 are to be separated from the wiring of second trench gate 37. Thus, in the following, the source and drain connections of first trench gates 35, 36 are designated as first source connections and first drain connections, respectively, and the source and drain connections of second trench gates 37 are designated as second source connections and second drain connections, respectively.

Figure 5:
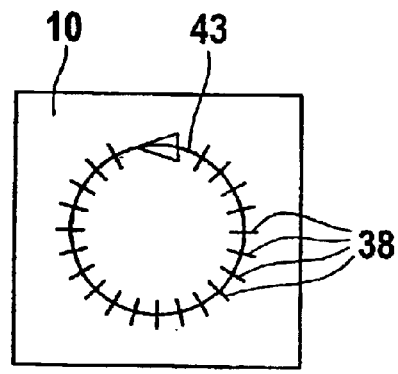
FIG. 5 shows a second exemplary embodiment of an arrangement of trench gates.

FIG. 5 shows a second exemplary embodiment of an arrangement of trench gates according to the present invention.

In FIG. 5, an annular third magnetic field 43 is to be measured, the first trench gates, to be handled jointly with respect to their source and drain connections, again in each case being arranged orthogonally with respect to the magnetic field to be measured—in this case third magnetic field 43. The first trench gates, shown in the second exemplary embodiment of an arrangement of trench gates, are provided with reference numeral 38 in FIG. 5. However, because of the form of third magnetic field 43, first trench gates 38, which correspond to first trench gates 35, 36 from FIG. 4, are not necessarily arranged in parallel, but rather according to ray segments in the radial direction, starting from a center point which corresponds to the center point of third magnetic field 43.

In addition to the implementation of the vertical MOS channel of current-carrying region 80 in a pure trench MOS process, as, for example, for power field-effect transistors and the like, it is also provided according to the present invention to use mixed processes such as a BCD process (bipolar CMOS-DMOS process), so that the trench MOS structures of sensor substrate region 5 according to FIGS. 2 and 3 are combined with other circuit breakers in appropriate processes. In addition, it is therefore possible and advantageous according to the present invention to integrate intelligence on the sensor chip, i.e. substrate 10, in order, for example, to monolithically integrate driver circuits and evaluation circuits. Because the trench MOS cells are able to be implemented in mixed processes, e.g. BCD processes, or generally in CMOS processes, the combination and integration with logic elements or with intelligence very advantageously presents itself.

What is claimed is:

1. A device for measuring a strength of a vector component of a magnetic field, comprising:
    a field-effect transistor including at least one first trench gate, an orientation of a wall of the at least one first trench gate being provided orthogonally with respect to the vector component;
    wherein the at least one field-effect transistor includes at least one second trench gate provided at one of an acute angle and an obtuse angle with respect to the vector component,
    the at least one field-effect transistor includes a first source connection allocated to the at least one first trench gate, one first drain connection allocated to the at least one first trench gate, one second source connection allocated to the at least one second trench gate, and one second drain connection allocated to the at least one second trench gate, and at least one of the following:
        the first source connection and the second source connection are electrically isolated from one another, and
        the first drain connection and the second drain connection are electrically isolated from one another.

2. A device for measuring a strength of a vector component of a magnetic field, comprising:
    a field-effect transistor including at least one first trench gate, an orientation of a wall of the at least one first trench gate being provided orthogonally with respect to the vector component;
    wherein the at least one first trench gate includes a plurality of first trench gates, the magnetic field is at least locally curved, and walls of the first trench gates are parallel to a local curvature of radius of the magnetic field.

3. A device for measuring a strength of a vector component of a magnetic field, comprising:
    a field-effect transistor including at least one first trench gate, an orientation of a wall of the at least one first trench gate being provided orthogonally with respect to the vector component;
    wherein the at least one first trench gate includes a plurality of first trench gates, and walls of the plurality of first trench gates are oriented parallel to one another.

4. A device for measuring a strength of a vector component of a magnetic field, comprising:
    a field-effect transistor including at least one first trench gate, an orientation of a wall of the at least one first trench gate being provided orthogonally with respect to the vector component;
    wherein the at least one first trench gate includes a plurality of first trench gates, and walls of the first trench gates are oriented in such a way that imaginary straight extensions of the walls intersect at a common point.

* * * * *